(12) United States Patent
Gim et al.

(10) Patent No.: US 11,549,178 B2
(45) Date of Patent: Jan. 10, 2023

(54) APPARATUS FOR TREATING SEMICONDUCTOR PROCESS GAS AND METHOD OF TREATING SEMICONDUCTOR PROCESS GAS

(71) Applicant: Samsung Electronics Co., Ltd., Suwon-si (KR)

(72) Inventors: Suji Gim, Hwaseong-si (KR); Sunwoo Yook, Seoul (KR); Youngduk Ko, Nonsan-si (KR); Youngseok Roh, Suwon-si (KR); Seoyoung Maeng, Seoul (KR); Jongyong Bae, Hwaseong-si (KR); Jihnkoo Lee, Nonsan-si (KR); Jungjoon Pyeon, Suwon-si (KR); Jongha Hwang, Nonsan-si (KR)

(73) Assignees: Samsung Electronics Co., Ltd., Gyeonggi-do (KR); PureSphere Co., Ltd., Nonsan-si (KR)

( * ) Notice: Subject to any disclaimer, the term of this patent is extended or adjusted under 35 U.S.C. 154(b) by 0 days.

(21) Appl. No.: 17/510,532

(22) Filed: Oct. 26, 2021

(65) Prior Publication Data

US 2022/0205094 A1 Jun. 30, 2022

(30) Foreign Application Priority Data

Dec. 29, 2020 (KR) .................... 10-2020-0186527

(51) Int. Cl.
 *C23C 16/455* (2006.01)
 *B01J 35/00* (2006.01)
 (Continued)

(52) U.S. Cl.
 CPC .... *C23C 16/45502* (2013.01); *B01D 53/9418* (2013.01); *B01J 35/0006* (2013.01);
 (Continued)

(58) Field of Classification Search
 CPC .......... C23C 16/45502; C23C 16/45534; B01J 35/0006; B01J 35/04; B01J 37/08; B01D 53/9418
 See application file for complete search history.

(56) References Cited

U.S. PATENT DOCUMENTS 7,455,720 B2  11/2008 Gu
2008/0124670 A1  5/2008 Jansen
(Continued)

FOREIGN PATENT DOCUMENTS

JP 6007715 B2 10/2016
KR 10-2000-0051830 A 8/2000
(Continued)

*Primary Examiner* — Timothy C Vanoy
(74) *Attorney, Agent, or Firm* — Harness, Dickey & Pierce, P.L.C.

(57) ABSTRACT

An apparatus and method for treating a semiconductor process gas comprises a gas inlet allowing a treatment target gas (or gas to be treated) to flow therethrough; a catalytic reaction portion including a catalyst and configured to allow the treatment target gas to be brought into contact with the catalyst; a space velocity controller between the gas inlet and the catalytic reaction portion, the space velocity controller extending from the gas inlet in a diagonal direction in relation to the gas inlet; a differential pressure buffer portion between the space velocity controller and the catalytic reaction portion and including a filter; and a gas outlet configured to externally discharge a product formed as the treatment target gas comes into contact with the catalyst.

20 Claims, 12 Drawing Sheets

(51) Int. Cl.
 *B01J 35/04* (2006.01)
 *B01D 53/94* (2006.01)
 *B01J 37/08* (2006.01)

(52) U.S. Cl.
 CPC ......... *B01J 35/04* (2013.01); *C23C 16/45534* (2013.01); *B01J 37/08* (2013.01)

(56) References Cited

U.S. PATENT DOCUMENTS

| | | |
|---|---|---|
| 2013/0224090 A1 | 8/2013 | Lee et al. |
| 2016/0136574 A1* | 5/2016 | Miller ............... B01F 25/31332 422/168 |
| 2019/0091677 A1 | 3/2019 | Bauer et al. |
| 2020/0122078 A1* | 4/2020 | Trent ..................... B64D 13/06 |

FOREIGN PATENT DOCUMENTS

| | | |
|---|---|---|
| KR | 10-0964320 B1 | 6/2010 |
| KR | 10-1464542 B1 | 11/2014 |
| KR | 10-1626541 B1 | 6/2016 |
| KR | 10-2018-0111881 A | 10/2018 |

* cited by examiner

APPARATUS FOR TREATING SEMICONDUCTOR PROCESS GAS AND METHOD OF TREATING SEMICONDUCTOR PROCESS GAS

CROSS-REFERENCE TO RELATED APPLICATION(S)

This application claims benefit of priority to Korean Patent Application No. 10-2020-0186527 filed on Dec. 29, 2020 in the Korean Intellectual Property Office, the disclosure of which is incorporated herein by reference in its entirety.

BACKGROUND

The present inventive concepts relate to an apparatus for treating a semiconductor process gas and a method of treating a semiconductor process gas, and more particularly, to an apparatus for treating a semiconductor process gas and a method of treating a semiconductor process gas capable of inhibiting formation of byproducts by a catalytic reaction of a process gas or an exhaust gas remaining after a semiconductor process.

In line with increasing demand for high performance, high speed, and/or multi-functionality in semiconductor devices, the degree of integration of semiconductor devices has increased. With the trend for high integration of semiconductor devices, the amount of a semiconductor process gas used to uniformly grow a film has gradually increased. An unreacted process gas discharged without forming a film of a semiconductor wafer may participate in an unintended chemical reaction to form powdery byproducts.

SUMMARY

Aspect of the present inventive concepts are to provide an apparatus and method of treating a process gas so as to inhibit formation of powdery byproducts.

According to an aspect of the present inventive concepts, an apparatus for treating a semiconductor process gas comprises: a gas inlet configured to allow a treatment target gas (or gas to be treated) to flow through; a catalytic reaction portion including a catalyst and configured to bring the treatment target gas into contact with the catalyst; a space velocity controller between the gas inlet and the catalytic reaction portion, the space velocity controller extending from the gas inlet in a diagonal direction in relation to the gas inlet; a differential pressure buffer portion between the space velocity controller and the catalytic reaction portion, the differential pressure buffer including a filter; and a gas outlet configured to externally discharge a product formed as the treatment target gas comes into contact with the catalyst.

According to an aspect of the present inventive concepts, an apparatus for treating a semiconductor process gas includes: a gas inlet configured to allow a treatment target gas (or gas to be treated) to flow through; a differential pressure buffer portion, including a filter, configured to reduce a pressure drop of the treatment target gas; and a catalytic reaction portion including a catalyst and configured to bring the treatment target gas into contact with the catalyst, wherein the differential pressure buffer portion is disposed between the gas inlet and the catalytic reaction portion.

According to an aspect of the present inventive concepts, a method of treating a semiconductor process gas includes: performing a semiconductor process on a semiconductor wafer in a process chamber; externally discharging a semiconductor process gas remaining after the semiconductor process from the process chamber; injecting the semiconductor process gas into a catalytic reactor including a catalyst; reducing a differential pressure of the semiconductor process gas in the catalytic reactor; reacting the semiconductor process gas with the catalyst in the catalytic reactor such that the semiconductor process gas is oxidized or reduced; and discharging, to the outside of the catalytic reactor, byproducts formed by the oxidation or reduction by the catalyst.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concepts will be described with reference to the accompanying drawings.

When the terms "about" or "substantially" are used in this specification in connection with a numerical value, it is intended that the associated numerical value includes a manufacturing tolerance (e.g., ±10%) around the stated numerical value. Further, it will be understood that these values and shapes should be construed as including a manufacturing or operational tolerance (e.g., ±10%) around the stated numerical values or shapes.

Figure 1:
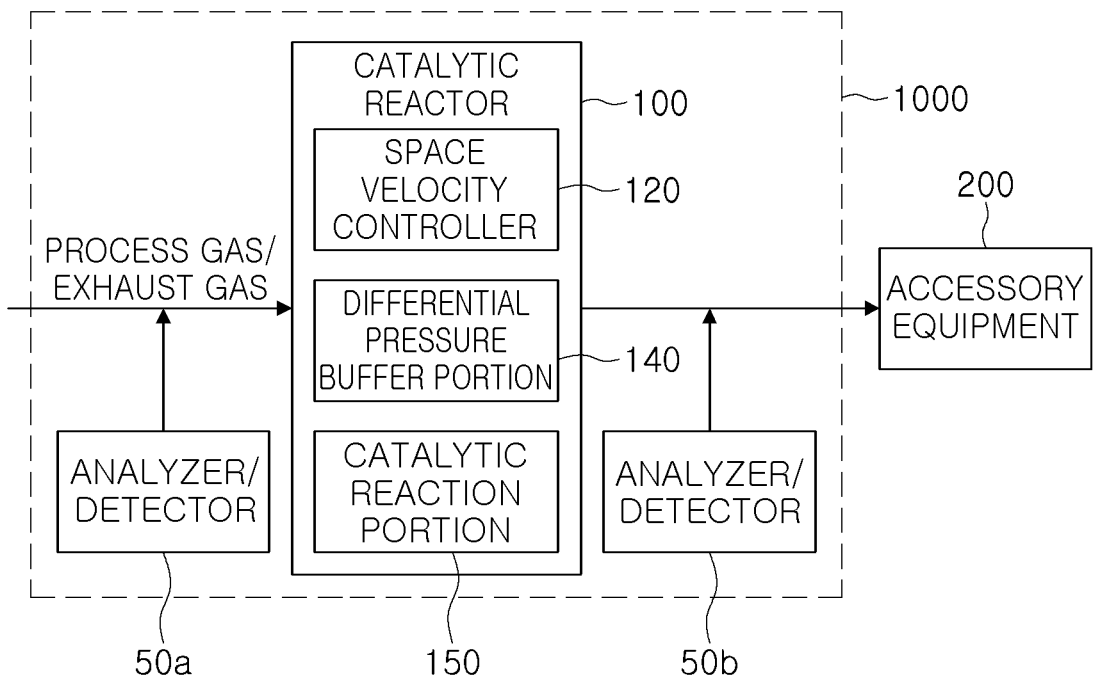
FIG. 1 is a schematic diagram of an apparatus for treating a semiconductor process gas according to some example embodiments.

FIG. 1 is a schematic diagram of an apparatus for treating a semiconductor process gas according to some example embodiments.

Referring to FIG. 1, an apparatus 1000 for treating a semiconductor process gas may include a catalytic reactor 100 into which a semiconductor process gas discharged from a process chamber after a semiconductor process is injected, and the catalytic reactor 100 may include a catalyst causing the semiconductor process gas to be oxidation-reduction reacted. In the present disclosure, the semiconductor process gas may be defined as a process gas remaining after the semiconductor process and/or an exhaust gas generated after the semiconductor process. In some example embodiments, the semiconductor process gas may include a gas converted into powdery byproducts. The semiconductor process gas may be referred to as a gas to be treated (and/or a treatment target gas).

In some example embodiments, the treatment target gas may include at least one of a basic gas, an acidic gas, and/or volatile organic compounds (VOCs). The basic gas may include, for example, ammonia ($NH_3$). The acidic gas may include, for example, HCl, HF, $B_2H_6$, and $BCl_3$. The catalyst included in the catalytic reactor 100 may include a material that oxidizes and/or reduces the treatment target gas.

In some example embodiments, the apparatus 1000 for treating a semiconductor process gas may be used in a process of forming an oxide and/or a nitride. For example, the apparatus 1000 may be used in a process of forming a gate electrode of a semiconductor device. In some example embodiments, the apparatus 1000 for treating a semiconductor process gas may be used in a process of generating a titanium nitride (TiN) film of a semiconductor device.

However, the use of the apparatus 1000 for treating a semiconductor process gas is not limited thereto. The apparatus 1000 for treating a semiconductor process gas may be used in a number of semiconductor processes that discharge gases capable of forming powdery byproducts. For example, the apparatus 1000 for treating a semiconductor process gas may be used in a semiconductor process using an organometallic precursor, a semiconductor process for forming a carbon film, or a semiconductor process using at least one of benzene, $BCl_3$, $PH_3$, perfluoro/sulfuric compound, $B_2H_6$, and/or silicon carbohydrate (e.g., TEOS).

The catalytic reactor 100 may include a differential pressure buffer portion 140 and a catalytic reaction portion 150. The differential pressure buffer portion 140 may reduce a pressure drop of the treatment target gas injected into the catalytic reactor 100. The catalytic reaction portion 150 may include a catalyst and cause a catalytic reaction of a treatment target gas to take place. In some example embodiments, the catalytic reactor 100 may further include a space velocity controller 120. The space velocity controller 120 may adjust velocity of the treatment target gas injected into the catalytic reactor 100 according to a set (or otherwise desired) reaction efficiency, and distribute the treatment target gas to be evenly diffused in the catalytic reactor 100.

In some example embodiments, the apparatus 1000 of treating a semiconductor process gas may include analyzers and/or detectors 50a and 50b connected to the front stage and/or rear stage of the catalytic reactor 1000. For example, the apparatus 1000 of treating a semiconductor process gas may include an analyzer and/or detector 50a disposed at the front stage of the catalytic reactor 100 and detecting a concentration and/or abnormality of the treatment target gas before the treatment target gas is injected; and/or the apparatus 1000 of treating a semiconductor process gas may include an analyzer and/or detector 50b disposed at the rear stage of the catalytic reactor 100 and detecting throughput and/or abnormality after a catalytic reaction in the catalytic reactor 100.

The rear stage of the catalytic reactor 100 may be connected to an accessory equipment 200 such as a pump, a scrubber, or a powder trap, so that the gas discharged after the catalytic reaction may flow to the auxiliary equipment 200.

In the apparatus 1000 of treating a semiconductor process gas, the arrangement of the catalytic reactor 100 may be variously altered. In some example embodiments, the catalytic reactor 100 may be disposed outside a semiconductor production facility that discharges a treatment target gas, and/or may be connected to the semiconductor production facility. In some example embodiments, the catalytic reactor 100 may be disposed inside the semiconductor production facility that discharges a treatment target gas. In some example embodiments, the catalytic reactor 100 may be disposed in a gas discharge portion inside the semiconductor production facility. In some example embodiments, the catalytic reactor 100 may be combined with the accessory equipment 200, such as a powder trap, and may be disposed inside the accessory equipment 200.

Figure 2:
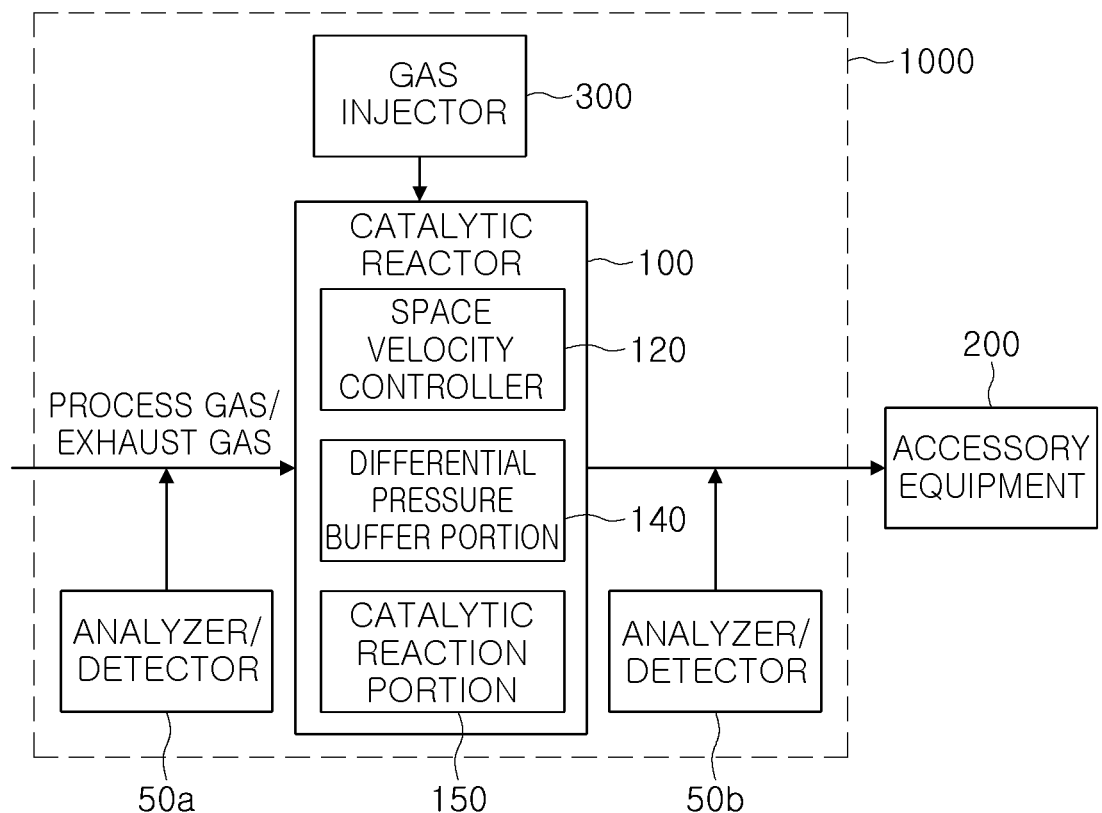
FIG. 2 is a schematic diagram of an apparatus for treating a semiconductor process gas according to some example embodiments.
Figure 3:
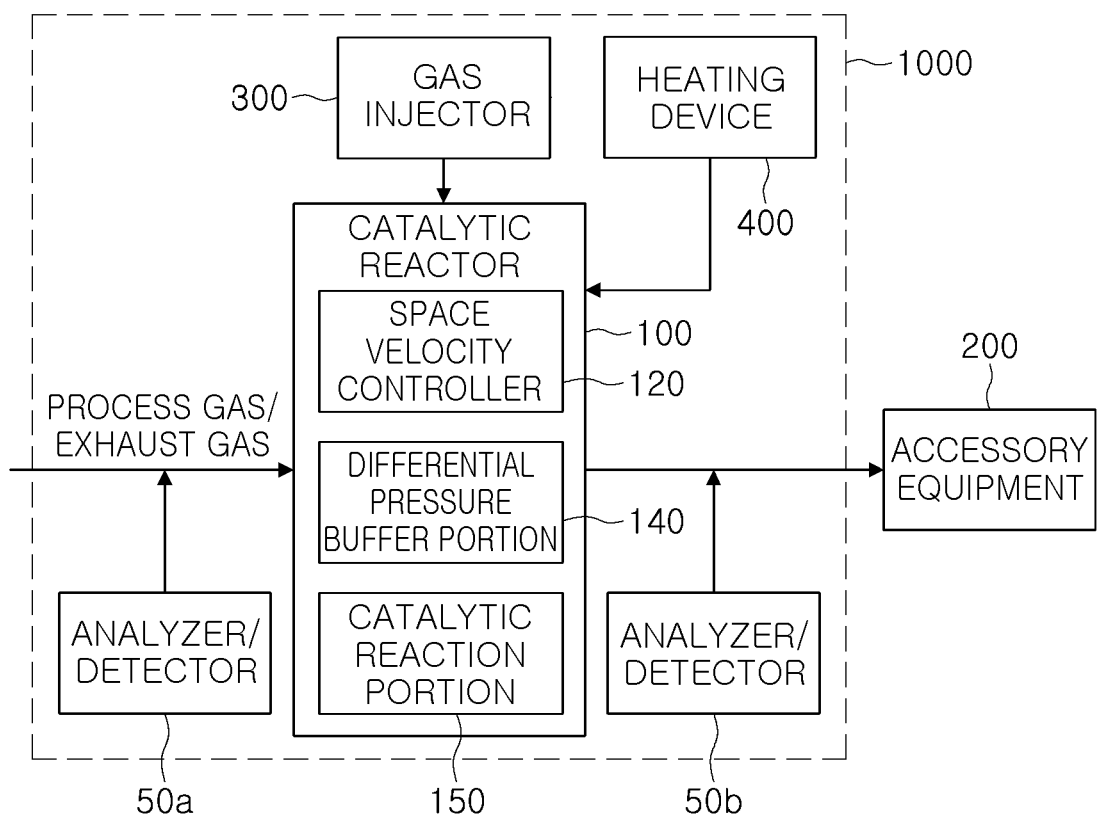
FIG. 3 is a schematic diagram of an apparatus for treating a semiconductor process gas according to some example embodiments.

In FIGS. 2 and 3, the same description of FIG. 1 may be equally applied to components which are the same as those of FIG. 1.

FIG. 2 is a schematic diagram of an apparatus for treating a semiconductor process gas according to an embodiment.

Referring to FIG. 2, the apparatus 1000 of treating a semiconductor process gas may further include a gas injector 300 connected to the catalytic reactor 100.

In an embodiment, the gas injector 300 may include a dilution gas injector for injecting a dilution gas for diluting a concentration of the treatment target gas into and/or in the catalytic reactor 100. The catalytic reactor 100 and the dilution gas injector may be arranged so that a diluted process gas may be introduced into the catalytic reactor 100. For example, a path through which the process gas is introduced into the catalytic reactor 100 and a path through which the dilution gas supplied by the dilution gas injector is introduced into the catalytic reactor 100 may be the same. Additionally, in some example embodiments, the dilution gas supplied by the dilution gas injector may be connected to be introduced into the catalytic reactor 100 through a path different from the path through which the treatment target gas is introduced. In some embodiments, the dilution gas may include an inert gas and/or may include a gas (or compound) assisting in the oxidation and/or reduction of the semiconductor process gas.

In some example embodiments, the gas injector 300 may include a cooling gas injector for injecting a cooling gas to reduce a temperature of the treatment target gas in and/or into the catalytic reactor 100. The cooling gas injector may inject the cooling gas so that a heating value generated by a catalytic reaction does not exceed heat resistance of a component of the gas injector 300.

In some example embodiments, the gas injector 300 may include an oxidizing agent injector for additionally injecting an oxidizing agent, for example oxygen, into the catalytic reactor 100.

FIG. 3 is a schematic diagram of an apparatus for treating a semiconductor process gas according to an embodiment.

Referring to FIG. 3, the apparatus 1000 of treating a semiconductor process gas may further include a heating device 400 connected to the catalytic reactor 100. The heating device 400 may be connected to the catalytic reactor 100 to increase a temperature inside the catalytic reactor 100. Though illustrated as included with the gas injector 300, the apparatus 1000 for treating a semiconductor process gas is not limited thereto, and the gas injector 300 and the heating device 400 may, in some embodiments, be provided together (as illustrated) and/or individually (not illustrated).

Figure 4:
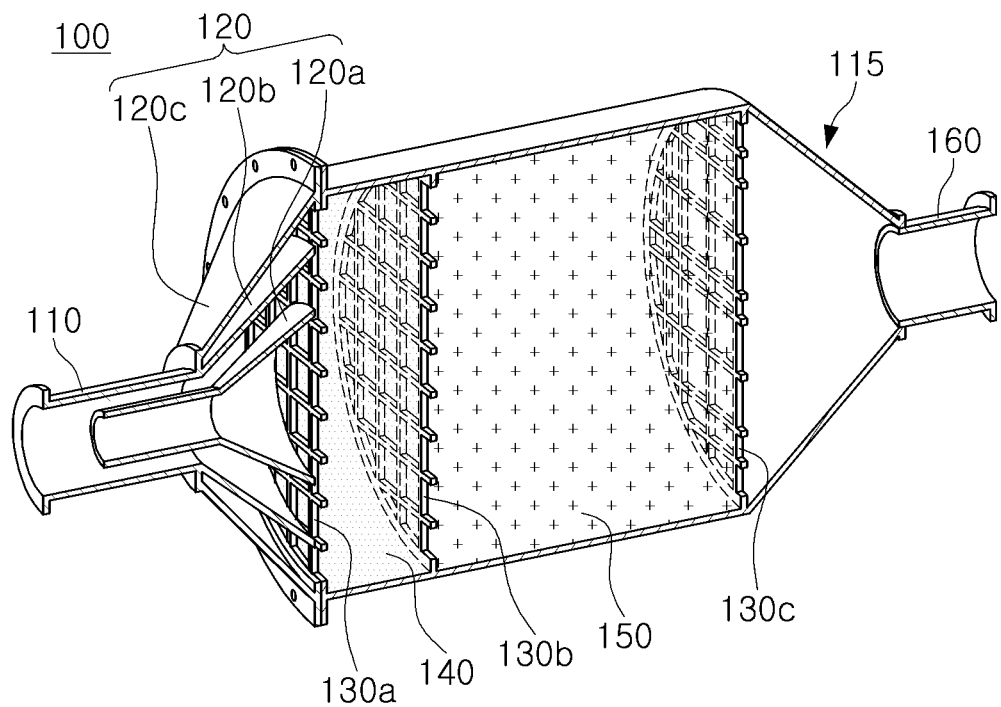
FIG. 4 is a schematic half cut-away perspective view of a catalytic reactor according to some example embodiments.
Figure 5:
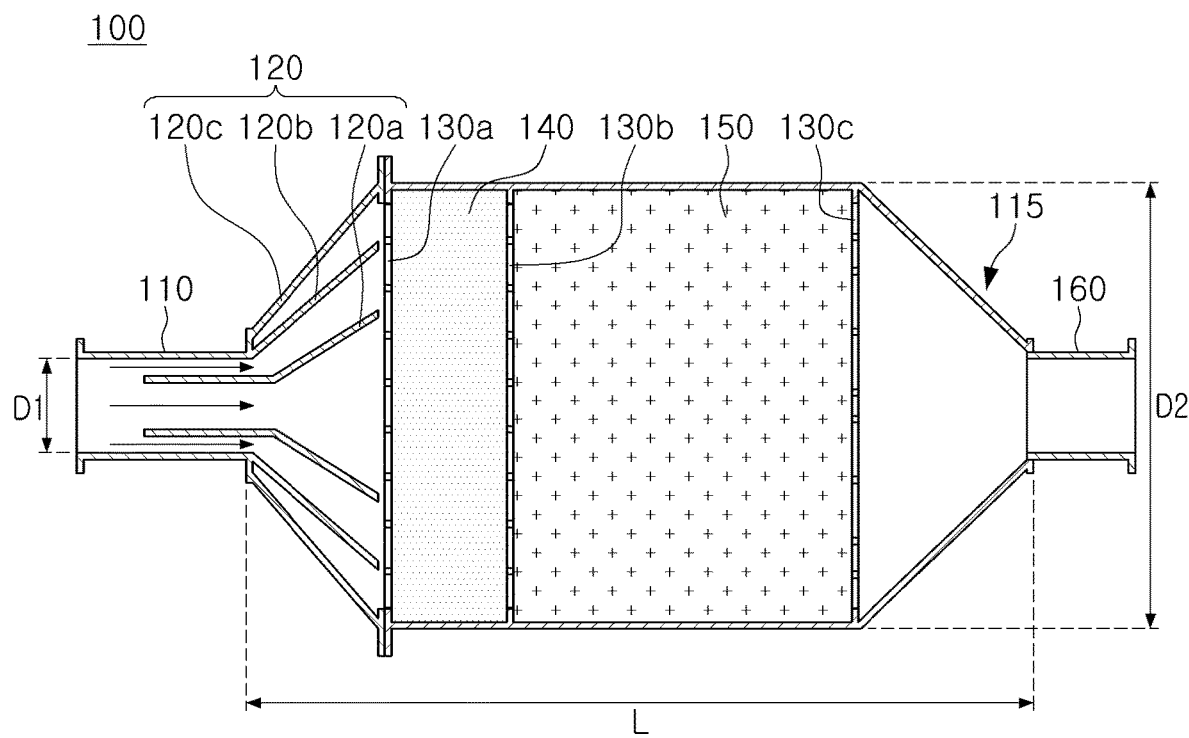
FIG. 5 is a schematic cross-sectional view of a catalytic reactor according to some example embodiments.
Figure 6:
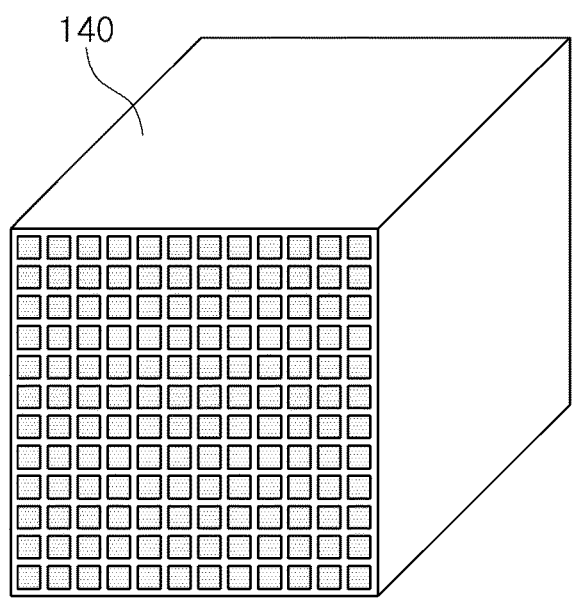
FIG. 6 is a schematic perspective view of a filter including a differential pressure buffer portion of a catalytic reactor according to some example embodiments.
Figure 7:
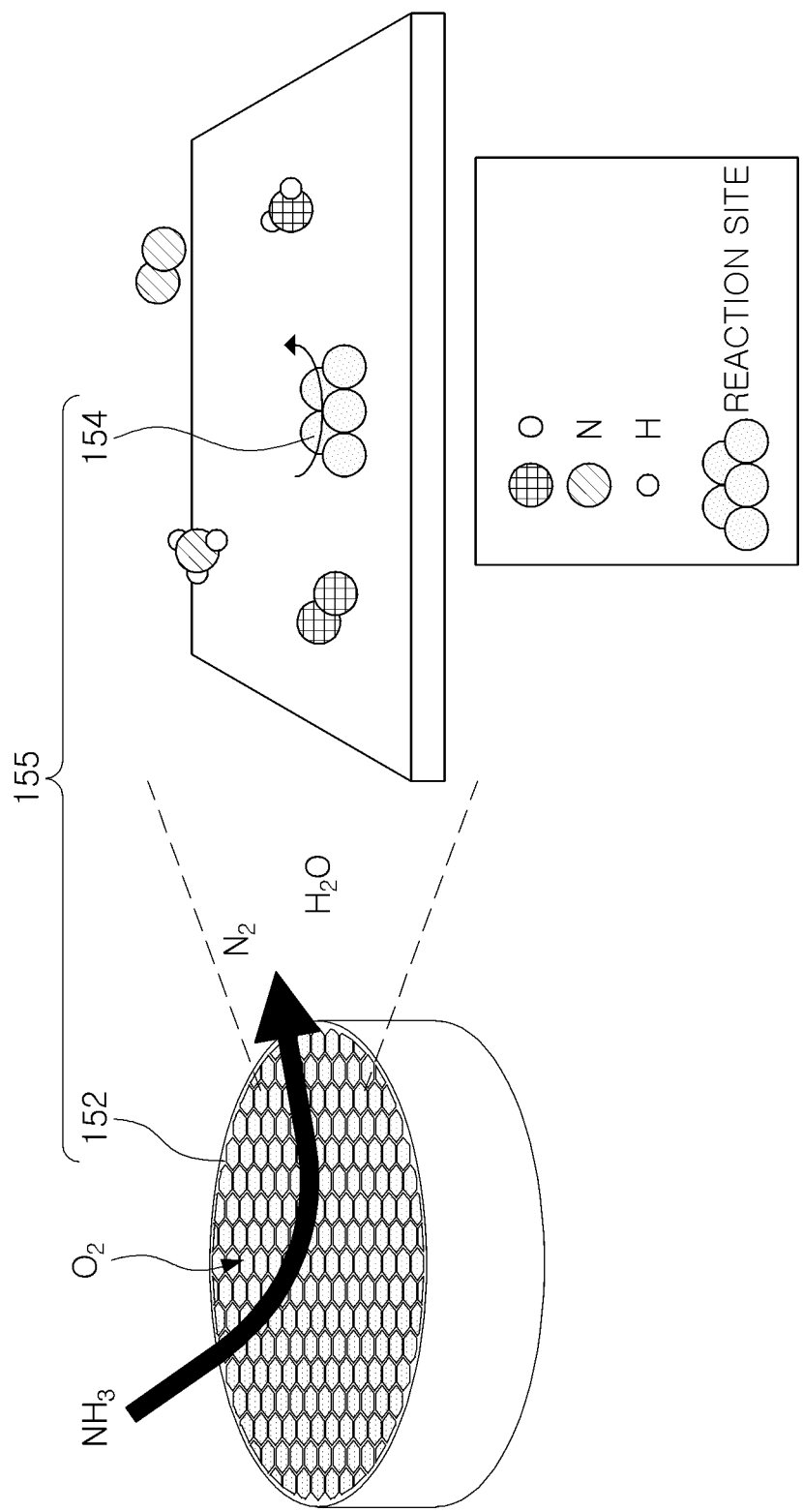
FIG. 7 is a schematic perspective view and an enlarged view of a catalytic reaction portion of a catalytic reactor according to some example embodiments.

FIG. 4 is a schematic half-cutaway perspective view illustrating the arrangement and schematic form of the internal components of the catalytic reactor 100 according to some embodiments. FIG. 5 is a schematic cross-sectional view of a catalytic reactor according to some embodiments. FIG. 6 is a schematic perspective view of a filter included in a differential pressure buffer portion of a catalytic reactor according to some embodiments. FIG. 7 is a schematic perspective view and an enlarged view of a catalytic reaction portion of a catalytic reactor according to some embodiments. The enlarged view of FIG. 7 illustrates an oxidation-reduction reaction of the treatment target gas at a reaction site of a catalyst.

Referring to FIGS. 4 through 7, the catalytic reactor 100 may include a differential pressure buffer portion 140 and a catalytic reaction portion 150. In some example embodiments, the catalytic reactor 100 may further include a gas inlet 110, a space velocity controller 120, and a gas outlet 160. In some example embodiments, the catalytic reactor 100 may include a first support 130a and a second support 130b arranged on a first surface of the differential pressure buffer portion 140 and a second surface of the differential pressure buffer portion 140 opposing the first surface, respectively. In some example embodiments, the catalytic reactor 100 may include a first surface of the catalytic reaction portion 150 facing the second surface of the differential pressure buffer portion 140 and a second surface of the catalyst reaction portion 150 opposing the first surface of the catalytic reaction portion 150, and may further include a third support 130c disposed on the second surface of the catalytic reaction portion 150.

A size of the catalytic reactor 100 may be variously altered according to a speed and concentration of a treatment target gas, a treatment rate, and/or a target replacement period of the catalyst, and/or the characteristics of an installation component of the catalytic reactor 100. A length L of a body 115 corresponding to a portion of the catalytic reactor 100 (e.g., excluding the gas inlet 110 and the gas outlet 160) may be changed according to a concentration of the treatment target gas and/or a treatment amount according to a treatment rate of the catalyst. As the concentration of the treatment target gas is higher or the treatment rate of the catalyst is lower, the length L of the body 115 of the catalytic reactor 100 may be increased to increase a treatment amount. In an example embodiment, the length L of the body 115 of the catalytic reactor 100 applied to a gate electrode forming process may range from about 250 mm to about 350 mm. If the body 115 of the catalytic reactor 100 has a length smaller than the above range, a treatment amount of the gate electrode formation process gas may be relatively lowered.

The treatment target gas may be introduced into the catalytic reactor 100 through the gas inlet 110. In some example embodiments, the gas inlet 110 may be connected to the gas discharge portion inside the semiconductor production facility and/or may be connected to a pipe connected to the semiconductor production facility.

In an example embodiment, the gas inlet 110 may include a plurality of passages through which the treatment target gas moves. For example, the gas inlet 110 may include cylindrical and/or conic passages having different diameters from each other. For example, the gas inlet 110 may have a shape in which a cylinder having a smaller diameter is arranged in a cylinder having a larger diameter. For example, the gas inlet 110 may include a first passage having a first diameter, and a second passage surrounding the first passage and having a larger diameter than the first passage. Two cylinder-shaped passages of the gas inlet 110 are illustrated but the number of the passages of the gas inlet 110 is not limited thereto and may be variously altered.

In some example embodiments, when the gas inlet 110 is connected to the gas discharge portion inside the semiconductor production facility, a diameter D1 of the gas inlet 110 may be formed to match a diameter of the gas discharge portion so that the gas inlet 110 may be connected to the gas discharge portion. In an example embodiment, when the gas inlet 110 is connected to a pipe connected to the semiconductor production facility, the diameter D1 of the gas inlet 110 may be formed to match a diameter of the pipe so that the gas inlet 110 may be connected to the pipe.

As shown in FIG. 5, a diameter D2 of the body 115 corresponding to a portion of the catalytic reactor 100 excluding the gas inlet 110 and the gas outlet 160 may be larger than the diameter D1 of the inlet 110. The maximum diameter D2 of the body 115 of the catalytic reactor 100 may be larger than the diameter D1 of the inlet 110. In the case of treating a gas having a relatively high flow rate, the diameter D2 of the body 115 may be formed larger than that of a case of treating a gas having a relatively low flow rate. In an example embodiment, the diameter D2 of the body 115 of the catalytic reactor 100 applied to the gate electrode formation process may range from about 100 φ to about 700 φ.

The space velocity controller 120 may extend from the gas inlet 110 in a diagonal direction in relation to the gas inlet 110 as shown in FIGS. 4 and 5. The space velocity controller 120 may have a width gradually increasing from the gas inlet 110 toward the differential pressure buffer portion 140. For example, the space velocity controller 120 may have a conic and/or bell shape. Since the space velocity controller 120 has a width that gradually increases from the gas inlet 110 toward the differential pressure buffer portion 140, the introduced treatment target gas may be evenly diffused in the catalytic reactor 100.

The space velocity controller 120 may include a plurality of dispersion portions 120a and 120b each extending from a plurality of cylindrical passages of the gas inlet 110 in a diagonal direction. For example, the space velocity controller 120 may include a first dispersion portion 120a having a first width and a second dispersion portion 120b having a second width greater than the first width. The second dispersion portion 120b may be disposed to surround the first dispersion portion 120a. Though a space velocity controller 120 with dispersion portions 120a and 120b is illustrated the number of the passages is not limited thereto and may be variously altered and a number of structures included in the space velocity controller 120 (e.g., dispersion portions 120a and 120b) may be adjusted accordingly.

The space velocity controller 120 may further include an outer wall 120c surrounding the plurality of dispersion portions 120a and 120b. The outer wall 120c of the space velocity controller 120 may have a shape extending from the gas inlet 110 in a diagonal direction, similar to the dispersion portions 120a and 120b. In some example embodiments, a shape of the outer wall 120c of the space velocity controller 120 may be variously altered.

The differential pressure buffer portion 140 may include a filter for reducing a pressure drop of a treatment target gas. The differential pressure buffer portion 140 may be disposed between the space velocity controller 120 and the catalytic reaction portion 150. In some embodiments, the differential pressure buffer portion 140 may be disposed closer to the gas inlet 110 than the catalytic reaction portion 150.

Since the differential pressure buffer portion 140 is disposed between the space velocity controller 120 and the catalytic reaction portion 150, a pressure drop of the treatment target gas supplied to the catalytic reaction portion 150 may be reduced. The differential pressure buffer portion 140 may prevent a pressure drop that may be caused as powder formed by the semiconductor process gas covers the passage toward the catalytic reaction portion 150 before reaching the differential pressure buffer portion 140. Since the pressure drop of the treatment target gas is reduced, a catalytic reaction by the catalytic reaction portion 150 may be smoothly performed.

In some example embodiments, the filter of the differential pressure buffer portion 140 may have a honeycomb structure as shown in FIG. 6. One cell of the honeycomb-structured filter is illustrated as having a square shape, but is not limited thereto, and may have a geometric shape such as a circle, an oval, and/or a polygon (e.g., a rectangle and/or a hexagon). In some example embodiments, the differential pressure buffer portion 140 may include filters having a honeycomb structure having a size ranging from about 5×5×5 mm to about 50×50×50 mm. Since the differential pressure buffer portion 140 includes the filter having a honeycomb structure, a pressure drop of the treatment target gas supplied to the catalytic reaction portion 150 may be effectively reduced.

The first support 130a may be disposed on a first surface of the differential pressure buffer portion 140 facing the space velocity controller 120. The second support 130b may be disposed on a second surface of the pressure differential pressure buffer portion 140 opposing the first surface of the pressure differential pressure buffer portion 140. The first support 130a may be disposed between the differential pressure buffer portion 140 and the space velocity controller 120. The second support 130b may be disposed between the differential pressure buffer portion 140 and the catalytic reaction portion 150. For example, the first and second supports 130a and 130b may be disposed on both sides of the differential pressure buffering unit 140, respectively, to support filters included in the differential pressure buffering unit 140 so that the filters do not collapse. Additionally, in some example embodiments, the second support 130b may prevent the filter of the differential pressure buffer portion 140 and the catalyst of the catalytic reaction portion 150 from being mixed.

The first support 130a and the second support 130b may include a metal and/or metal alloy. In some example embodiments, the metal of first support 130a and the second support 130b may be and/or include a metal (and/or oxidized metal) that does not react with the treatment target gas. As shown in FIG. 4, the first support 130a and/or the second support 130b may have a mesh shape. Since the first support 130a has a mesh shape, the treatment target gas dispersed by the space velocity controller 120 may pass through the first support 130a and through the filter of the differential pressure buffer portion 140. In addition, since the second support 130b has a mesh shape, the treatment target gas that has passed through the differential pressure buffer portion 140 may reach the catalytic reaction portion 150.

The catalytic reaction portion 150 may include a catalyst. The catalytic reaction portion 150 may allow the treatment target gas to contact the catalyst for a catalytic reaction. In some example embodiments, the catalyst may be a metal catalyst including a metal. For example, the metal may include at least one of Cu, Pd, Rh, Pt, Co, V, Mn, Ir, W, and/or Fe. In an example embodiment, the catalyst may include a Cu catalyst when high selectivity is desired at low cost, and/or may include a noble metal catalyst when reactive (e.g., poisoning) resistance by a halogen group is required.

Referring to FIG. 7 together, the catalytic reaction portion 150 may include a catalyst 155 including a support body 152 and a reaction site 154. The support body 152 physically supports the reaction site 154, and the reaction site 154 may substantially participate in an oxidation-reduction reaction.

In an example embodiment, the support body 152 may have a honeycomb structure. In FIG. 7, the support body 152 is shown to have a circular honeycomb structure, but is not limited thereto, and may be variously altered, such as a polygon (e.g., a square, rectangle, hexagon, etc.) and/or an ovoid (e.g., an oval and/or ellipse). The shape and material of the support body 152 may be variously altered according to a reaction temperature and/or conditions.

In some example embodiments, a gas and a precursor used in the process of generating a titanium nitride (TiN) film may be ammonia ($NH_3$), nitrogen ($N_2$), and titanium tetrachloride ($TiCl_4$). As shown in the following reaction formula, powdery byproducts such as $NH_4Cl$ and $TiCl_4(NH_3)_2$ may be generated by a gas and precursor remaining after the process of generating a titanium nitride (TiN) film.

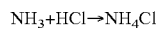

$$NH_3 + HCl \rightarrow NH_4Cl$$

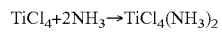

$$TiCl_4 + 2NH_3 \rightarrow TiCl_4(NH_3)_2$$

In order to inhibit formation of powdery byproducts due to the semiconductor process gas, the catalytic reaction portion 150 of the catalytic reactor 100 may remove the semiconductor process gas as a cause of the powdery byproducts. The catalyst 155 of the catalytic reaction portion 150 may oxidizes and/or reduces the semiconductor process gas, which is a cause of the powdery byproducts.

In an example embodiment, the treatment target gas that causes the powdery byproducts in the process of generating a titanium nitride (TiN) film is ammonia ($NH_3$), and the catalyst 155 includes an ammonia ($NH_3$) oxidizing agent, thereby ammonia ($NH_3$) may be removed by an oxidation reaction in the catalytic reaction portion 150 as shown in a reaction formula below and as shown in FIG. 7. In an example embodiment, a product generated as ammonia ($NH_3$), the treatment target gas, contacts the catalyst 155 may be nitrogen ($N_2$) gas and water ($H_2O$).

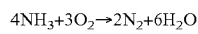

$$4NH_3 + 3O_2 \rightarrow 2N_2 + 6H_2O$$

Since formation of the powdery byproducts in the semiconductor process can be inhibited by the catalyst 155 included in the catalytic reaction portion 150, a problem that accessory equipment 200 (such as a pump, pipe, or the like), are stopped by the powdery byproducts may be solved.

Accordingly, production efficiency of the semiconductor device may be increased and management costs may be reduced.

The third support 130c may be disposed on the second surface of the catalytic reaction portion 150 opposing the first surface of the catalytic reaction portion 150 facing the differential pressure buffer portion 140. The third support 130c may include metal and may have a mesh shape. For example, the third support 130c may be the same and/or similar to the first support 130a and/or the second support 130b.

The gas outlet 160 may externally discharge a product formed as the treatment target gas contacts the catalyst in the catalytic reaction portion 150. For example, when the treatment target gas is ammonia ($NH_3$), a product formed as the treatment target gas contacts the catalyst 155 is nitrogen ($N_2$) gas, and nitrogen ($N_2$) is discharged to the outside through the gas outlet 160.

At least a portion of the body 115 connected to the gas outlet 160 may extend from the gas outlet 160 in a diagonal direction, similar to the outer wall 120c of the space velocity controller 120. For example, in some example embodiments, the portion between the catalytic reaction portion 150 and the gas outlet 160 may have a conical and/or bell-shape, but is not limited thereto.

Figure 8:
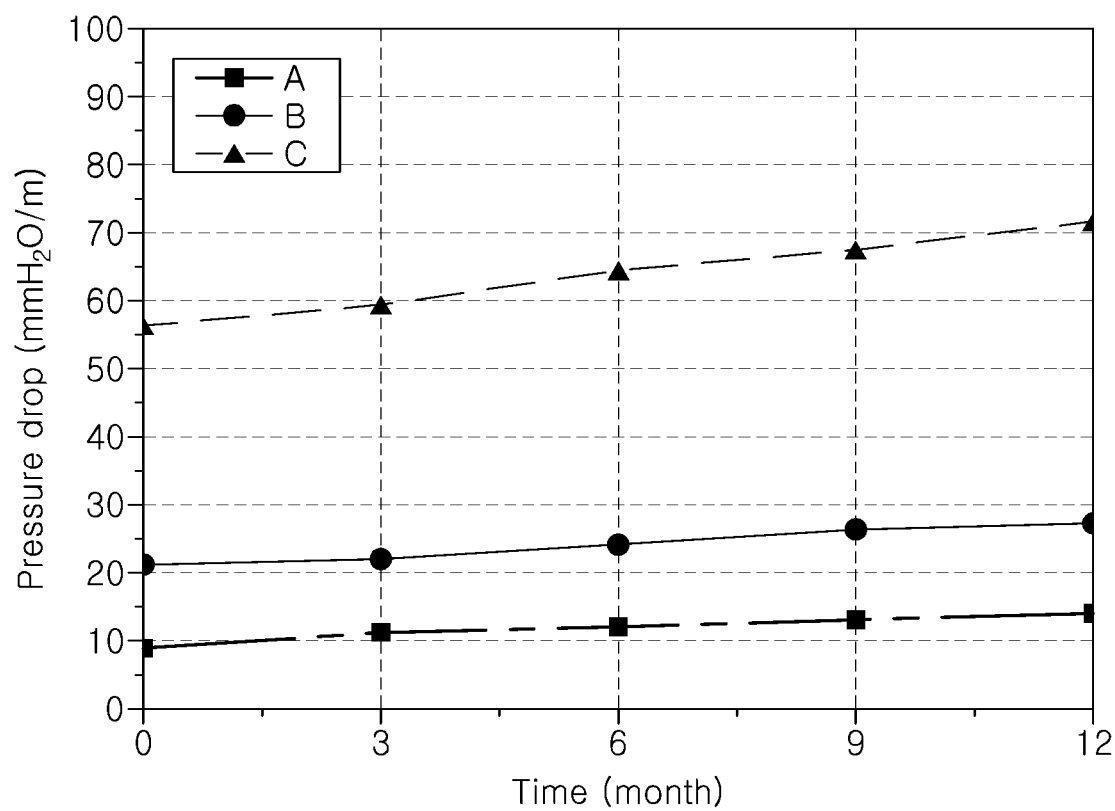
FIG. 8 is a graph illustrating a pressure drop over time according to types of filters included in a differential pressure buffer portion of the catalytic reactor according to some example embodiments.

FIG. 8 is a graph illustrating a pressure drop over time according to the types of filters included in a differential pressure buffer portion of the catalytic reactor according to some embodiments.

In the graph, "A" represents a pressure drop, over time, of a catalytic reactor including a filter having a size of 30×30×30 mm having a honeycomb structure, "B" represents a pressure drop, over time, of a catalytic reactor including a filter having a size of 8×8×8 mm having a honeycomb structure, and "C" represents a pressure drop, over time, of a catalytic reactor including a spherical pretreatment agent having a size ranging from about 5 mm to about 8 mm.

As shown in the graph, it can be seen that a pressure drop of the catalytic reactor including the filter having the honeycomb structure is smaller than a pressure drop of the catalytic reactor including the spherical pretreatment agent. In addition, it can be seen that a pressure drop of the catalytic reactor including the filter having the size of 30×30×30 mm is smaller than a pressure drop of the catalytic reactor including the filter having the size of 8×8×8 mm. Therefore, when the differential pressure buffer portion of the catalytic reactor includes the filter having the size of 30×30×30 mm, a catalytic reaction based on a catalyst may be further effectively performed by preventing an increase in differential pressure (e.g., due to powder) than in a case in which the catalytic reactor includes a spherical pretreatment agent.

Figure 9A:
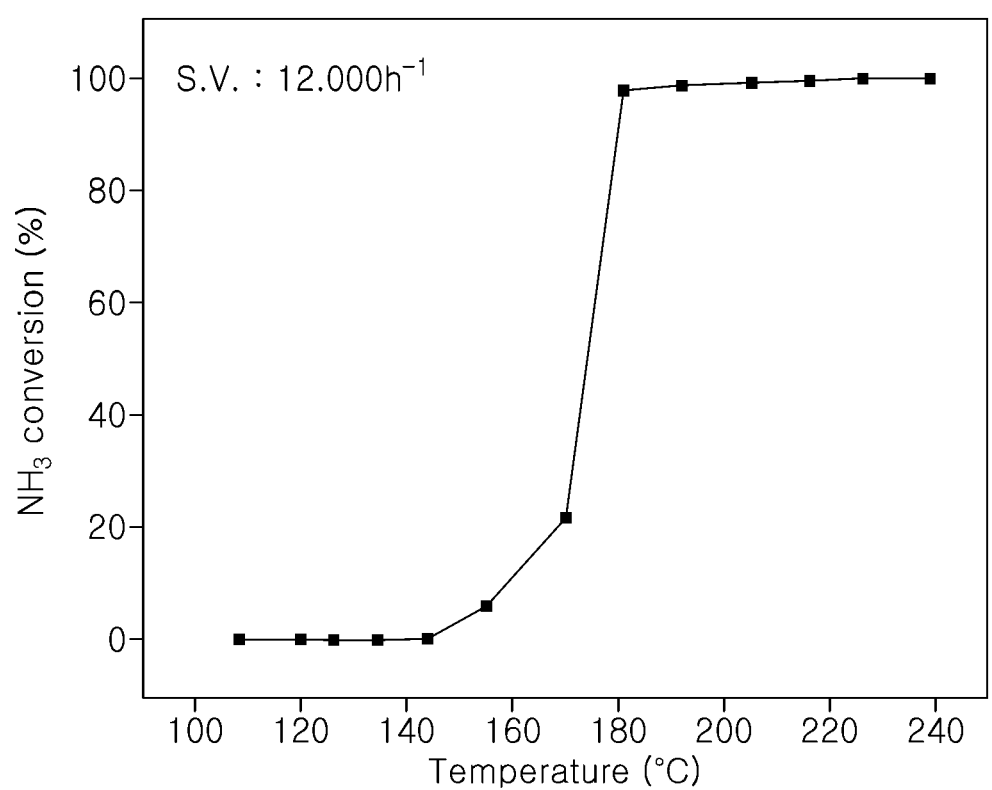
FIG. 9A is a graph illustrating throughput of a target gas over temperature in a catalytic reaction portion of a catalytic reactor according to some example embodiments.
Figure 9B:
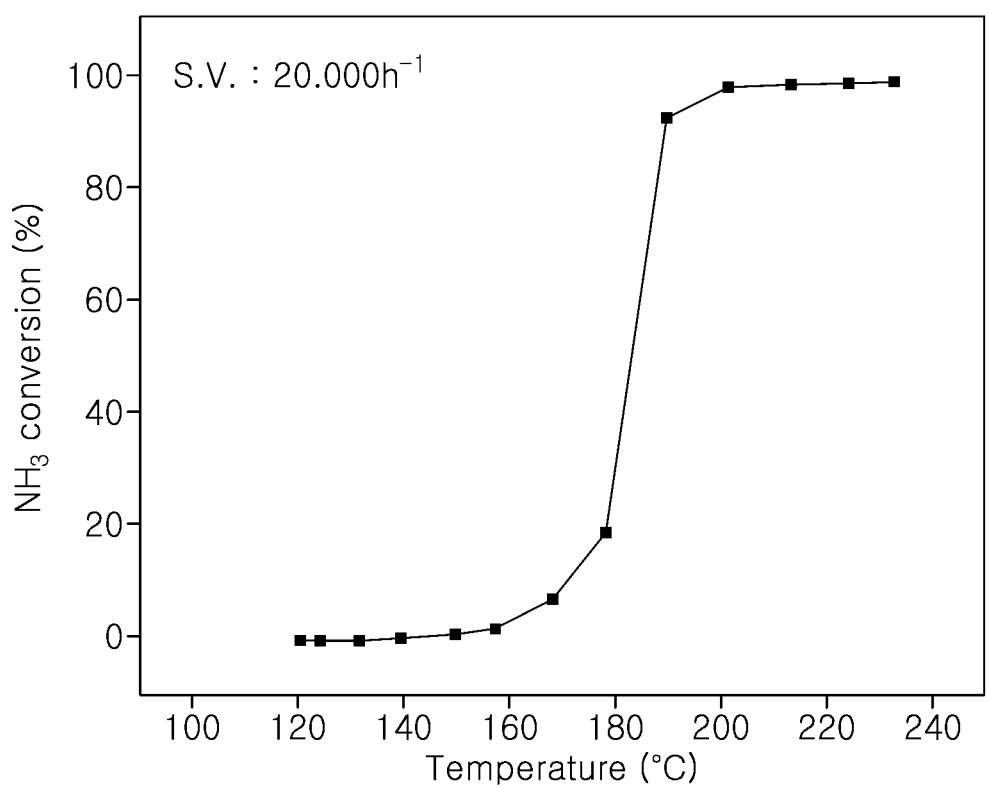
FIG. 9B is a graph illustrating throughput of a target gas over temperature in a catalytic reaction portion of a catalytic reactor according to some example embodiments.

FIGS. 9A and 9B are graphs separately illustrating a treatment amount of a target gas over temperature in a catalytic reaction portion of the catalytic reactor according to some embodiments. FIGS. 9A and 9B show cases in which ammonia ($NH_3$) (having the same concentration) was injected and the same type of catalyst was used. FIG. 9A shows a treatment amount of a target gas when a space velocity of the treatment target gas was 12000 $h^{-1}$, and FIG. 9B shows a treatment amount of a target gas when a space velocity of a treatment target gas was 20000 $h^{-1}$.

Referring to FIGS. 9A and 9B, it can be seen that, when $NH_3$ is injected into the catalytic reactor according to an example embodiment, ammonia ($NH_3$) exhibits a treatment amount of about 95% to about 99% within a temperature range of about 170° C. to about 240° C. That is, a treatment amount of a treatment target gas according to the catalytic reactor according to an example embodiment may be within the range of about 95% to about 99% when the space velocity is within the range of $12000^{h-1}$ to $20000^{h-1}$.

When a semiconductor process gas is catalytically reacted by the catalytic reactor including a catalyst according to example embodiments of the present inventive concepts, a removal rate of a causative substance that may form powdery byproducts is high, so that formation of powdery byproducts may be effectively inhibited and/or reduced.

Figure 10:
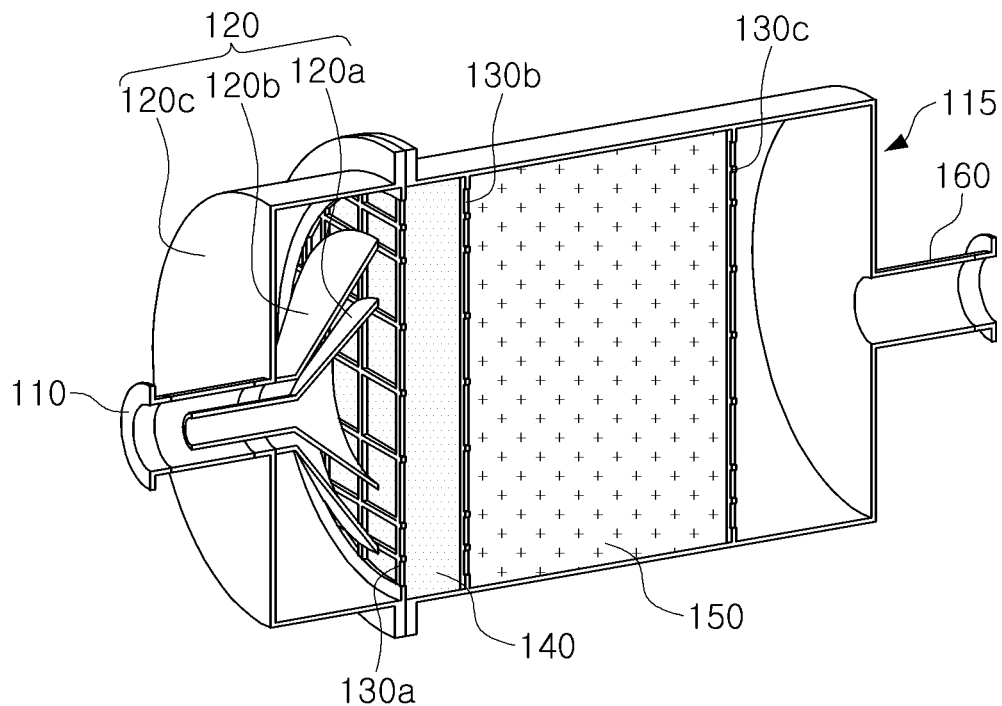
FIG. 10 is a schematic half cut-away perspective view of a catalytic reactor according to some example embodiments.
Figure 11:
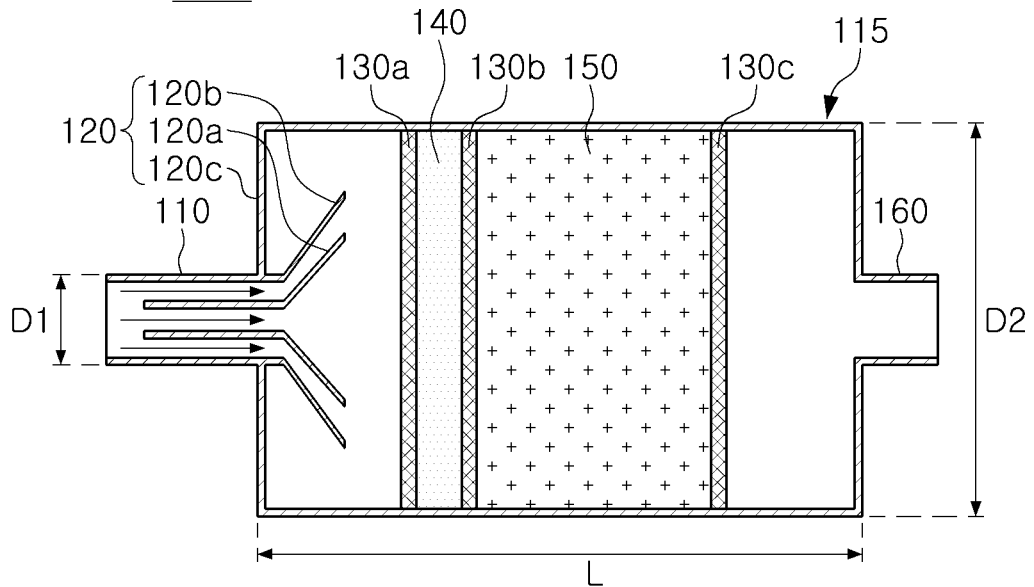
FIG. 11 is a schematic cross-sectional view of a catalytic reactor according to some example embodiments.

FIG. 10 is a schematic half-cut perspective view illustrating an arrangement and a schematic form of internal components of a catalytic reactor 100a of a catalytic reactor according to some embodiments. FIG. 11 is a schematic cross-sectional view of a catalytic reactor according to some embodiments.

Referring to FIGS. 10 and 11, a catalytic reactor 100a may have a cylindrical body 115. For example, an outer wall 120c of a space velocity controller 120 may have a cylindrical shape.

In an embodiment, a catalytic reaction portion 150 and a gas outlet 160 may have a cylindrical shape, but are not limited thereto. For example, though the outer wall 120c of the space velocity controller 120 and the portion of the body 115 connected to the gas outlet 160 are both illustrated as having cylindrical shapes, each may have, for example, a cylindrical, bell, and/or conic shape.

Figure 12:
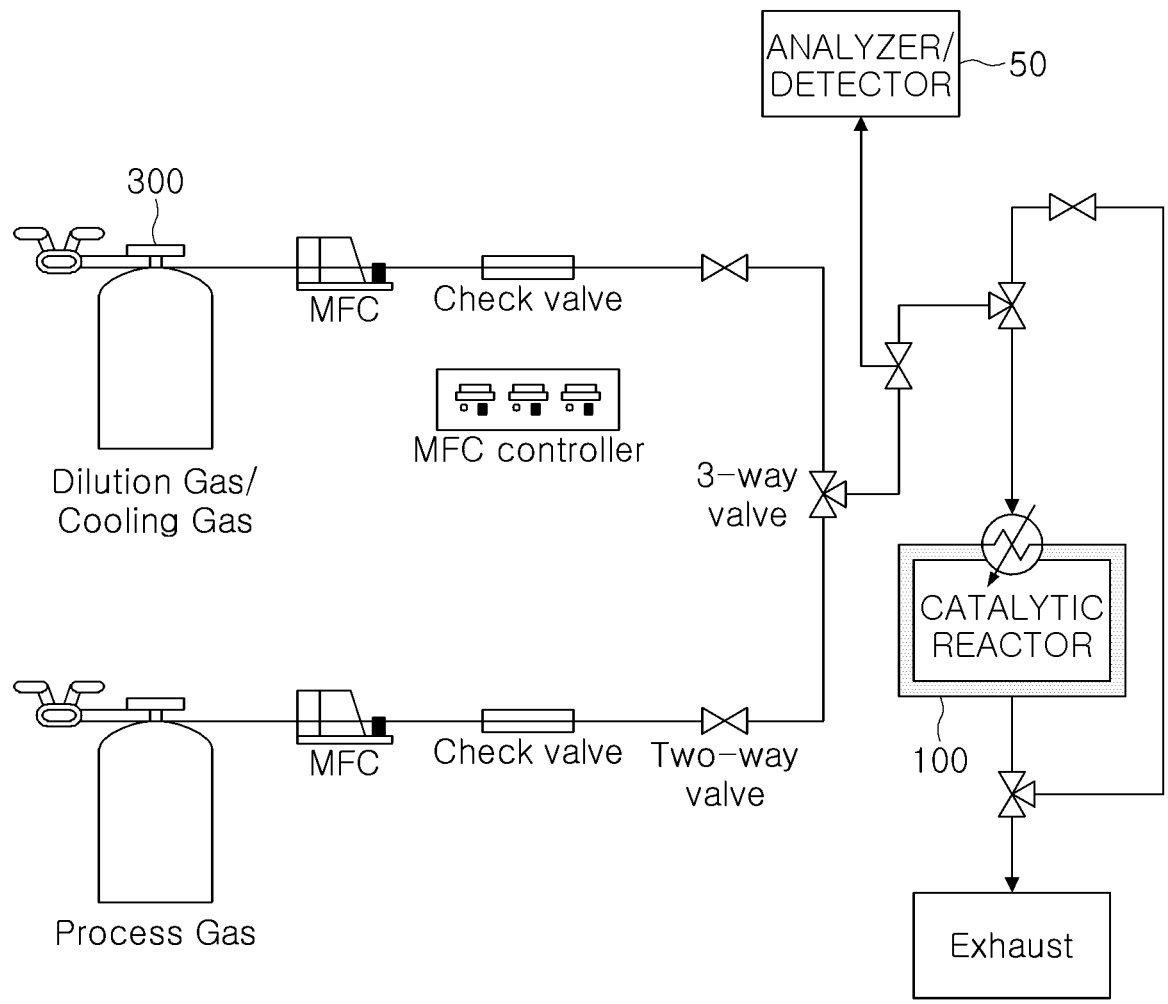
FIG. 12 is a block diagram of a system of an apparatus for treating a semiconductor process gas according to some example embodiments.

FIG. 12 is a block diagram of a system of an apparatus for treating a semiconductor process gas according to an embodiment.

Referring to FIG. 12, a system of treating a semiconductor process gas including an apparatus for treating a semiconductor process gas may include a catalytic reactor 100, an analyzer/detector 50, and a gas injector 300. The same description as the description set forth with reference to FIGS. 1 through 7 may be applied to the catalytic reactor 100.

A semiconductor process gas may flow from a semiconductor process facility, a pipe connected to the semiconductor process facility, or a pump connected to the semiconductor process facility. For example, the process gas source, though illustrated as a tank, may be and/or be included in a semiconductor process facility and/or a pump connected to the semiconductor process facility. For example, in some example embodiments, a processing chamber may be positioned between a process gas source and at least one of the MFC, check valve, two-way valve, and/or 3-way valve illustrated in FIG. 12.

A concentration of the semiconductor process gas may be measured, a temperature of the semiconductor process gas may be measured, or abnormality of the semiconductor process gas may be analyzed (e.g., by the analyzer/detector 50). The analyzer/detector 50 is shown to be connected so as to detect before the gas is injected into the catalytic reactor 100, but is not limited thereto, and a position of the analyzer/detector 50 may be variously altered. For example, the analyzer/detector 50 may be disposed at a rear end of the catalytic reactor; and/or an analyzer/detector 50 may be included in both the front end and the rear end, as illustrated in FIGS. 1 to 3.

In some example embodiments, when a concentration greater than an upper limit of a treatable concentration of the catalyst included in the catalytic reactor 100 (and/or greater than an upper operational tolerance) is detected by the analyzer/detector 50, the gas injector 300 may supply a dilution gas.

In some example embodiments, the gas injector 300 may supply a cooling gas when a temperature of the semiconductor process gas is higher than a reference (and/or operational tolerance) temperature.

The treatment target gas may be solely injected into the catalytic reactor 100, and, in some cases, the treatment target gas may be mixed with a dilution gas and/or a cooling gas by the gas injector 300 and injected into the catalytic reactor 100. The injected treatment target gas may be reacted with a catalyst in the catalytic reactor 100 and discharged.

An MFC controller may control mass flow controllers (MFC) and/or valves to regulate the flow of gasses in and out of the system. For example, the MFC controller and/or MFCs may include and/or be included in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc. In some embodiments, for example, the MFC controller may be included in processing circuitry configured to operate a semiconductor processing facility.

Although not shown in FIG. 12, the catalytic reactor 100 may be connected to a heating device as shown in FIG. 3 (depending on conditions of a reaction process) and heated by the heating device.

Figure 13:
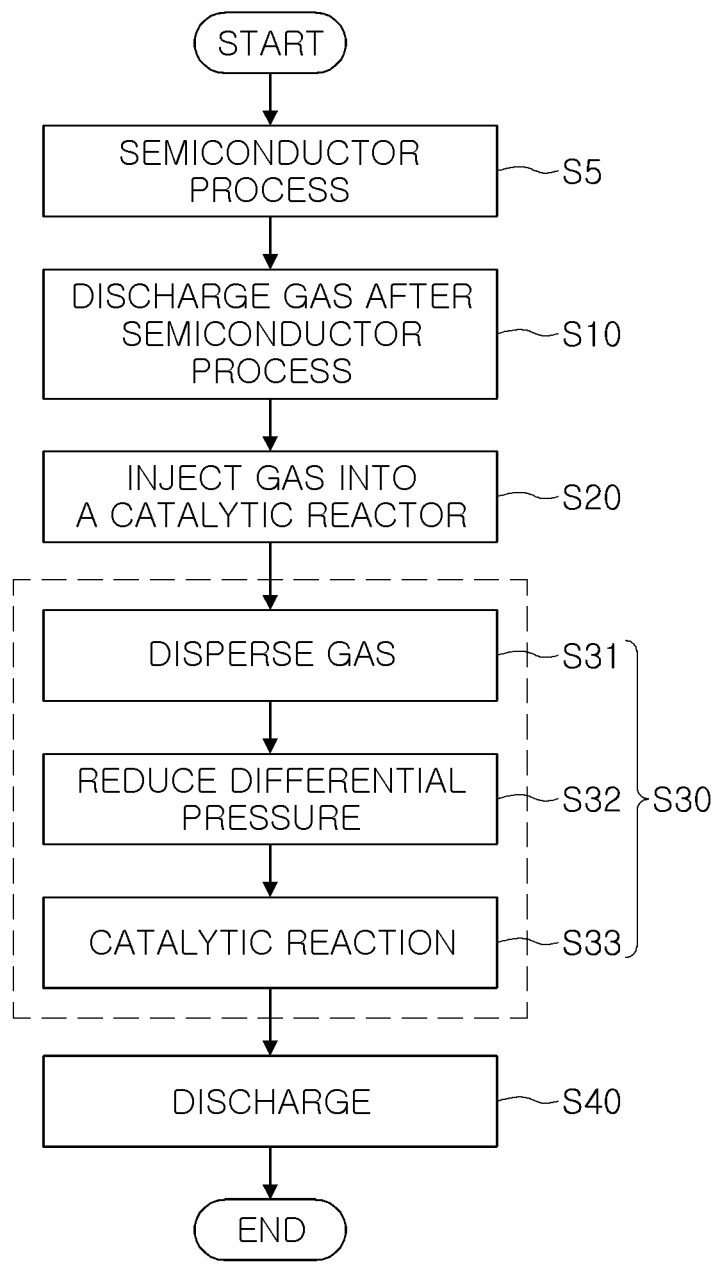
FIG. 13 is a flowchart illustrating a method of processing a semiconductor process gas according to some example embodiments.

FIG. 13 is a flowchart illustrating a method of treating a semiconductor process gas according to some embodiments.

Referring to FIG. 13, a method of treating a semiconductor process gas may include performing a semiconductor process on a wafer in a process chamber (S5); discharging a semiconductor process gas remaining after the semiconductor process operation (S10); injecting the semiconductor process gas into a catalytic reactor including a catalyst (S20); a semiconductor process gas converting operation (S30) of allowing a gas as a cause of powdery byproducts in the semiconductor process gas to be catalytically reacted by the catalyst of the catalytic reactor, and discharging a product formed as the gas, which is a cause of the powdery byproducts, is oxidized by the catalyst to the outside of the catalytic reactor (S40).

In some example embodiments, the semiconductor process S5 performed on the semiconductor wafer may include a deposition method (e.g., atomic layer deposition "ALD"), for depositing a metal nitride (e.g., titanium nitride (TiN)) and/or an oxide (e.g., a perovskite oxide).

In some example embodiments, the semiconductor process S5 may be a carbon film process using a hydrocarbon compound, but is not limited thereto, and may include various processes for producing a semiconductor device.

The semiconductor process gas converting operation (S30) may include an operation S31 in which the semiconductor process gas is dispersed (S31); an operation S32 of reducing a differential pressure of the semiconductor process gas; and a catalytic reaction operation (S33) in which a gas, which is a cause of powdery byproducts, included in the semiconductor process gas comes into contact with the catalyst and is oxidized.

The operation (S31) in which the semiconductor process gas is dispersed in the catalytic reactor may be performed by the space velocity controller 120 described above with reference to FIGS. 1 to 7. The semiconductor process gas may be evenly diffused in the catalytic reactor by the space velocity controller 120 (refer to FIGS. 1 through 7).

The operation (S32) of reducing a differential pressure of the semiconductor process gas may be performed by the differential pressure buffer portion 140 described above with reference to FIGS. 1 through 7. The pressure drop caused by the powdery byproducts formed before the semiconductor process gas is injected into the catalytic reactor may be buffered by the filter included in the differential pressure buffer portion 140.

The catalytic reaction operation (S33) may be an operation in which a gas, which is a cause of powdery byproducts in the semiconductor process gas, is oxidized by the catalyst included in the catalytic reaction portion 150.

In some example embodiments, in the catalytic reaction operation (S33), the catalyst included in the catalytic reactor may include an ammonia ($NH_3$) oxidizing agent, and ammonia included in the semiconductor process gas may come into contact with the ammonia oxidizing agent and may be oxidized to a stable gas that does not form byproducts, e.g., nitrogen ($N_2$) and/or a nitrogen oxide (NOx).

According to some example embodiments, when the catalytic reaction operation (S33) is performed by a catalyst including a support body having a honeycomb structure, the semiconductor process gas may effectively reach a reaction site, so that a catalytic reaction may be easily performed.

The operation (S40) of discharging the product formed by the oxidation-reduction reaction to the outside of the catalytic reactor may be performed in the gas outlet 160 of the catalytic reactor 100 shown in FIGS. 4 and 5. In an example embodiment, the operation of discharging the product formed by the oxidation-reduction reaction (S40) may be an operation in which a nitrogen ($N_2$) gas formed by oxidizing ammonia ($NH_3$) is discharged, after the catalytic reaction operation (S30) of ammonia ($NH_3$) is performed by the catalytic reactor including an ammonia ($NH_3$) oxidizing agent.

Figure 14:
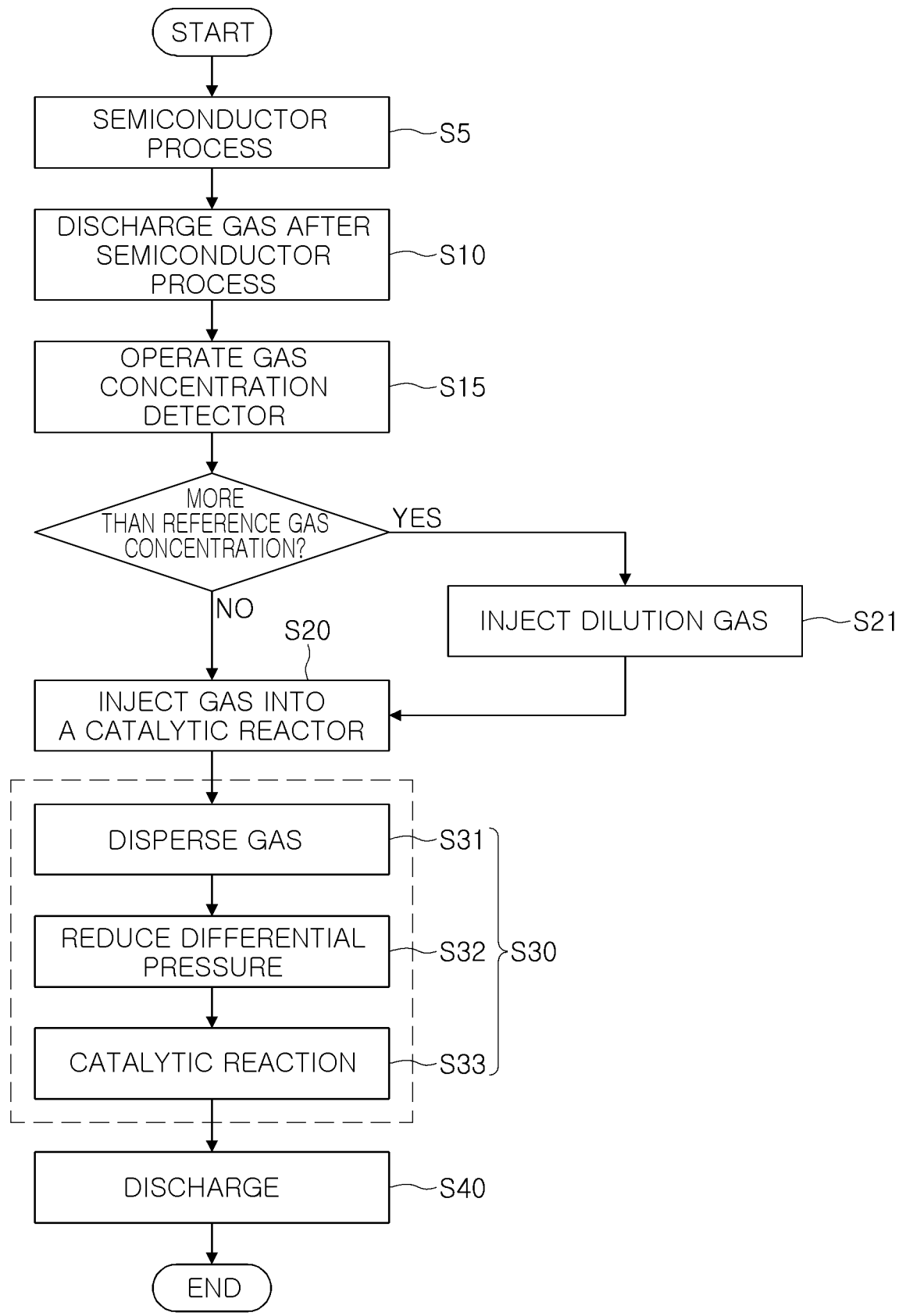
FIG. 14 is a flowchart illustrating a method of processing a semiconductor process gas according to some example embodiments.

FIG. 14 is a flowchart illustrating a method of processing a semiconductor process gas according to an embodiment.

Referring to FIG. 14, the method of processing a semiconductor process gas according to some example embodiments may further include an operation of operating a detector for detecting a concentration of a semiconductor process gas between the operation (S10) of discharging a semiconductor process gas and the operation (S20) of injecting a semiconductor gas in the method of treating a semiconductor process gas described above with reference to FIG. 13. The method of processing a semiconductor process gas according to some example embodiments may further include injecting a dilution gas into the catalytic reactor (S21) when the detector detects a concentration exceeding a treatable reference gas concentration of the catalyst included in the catalytic reactor.

Figure 15:
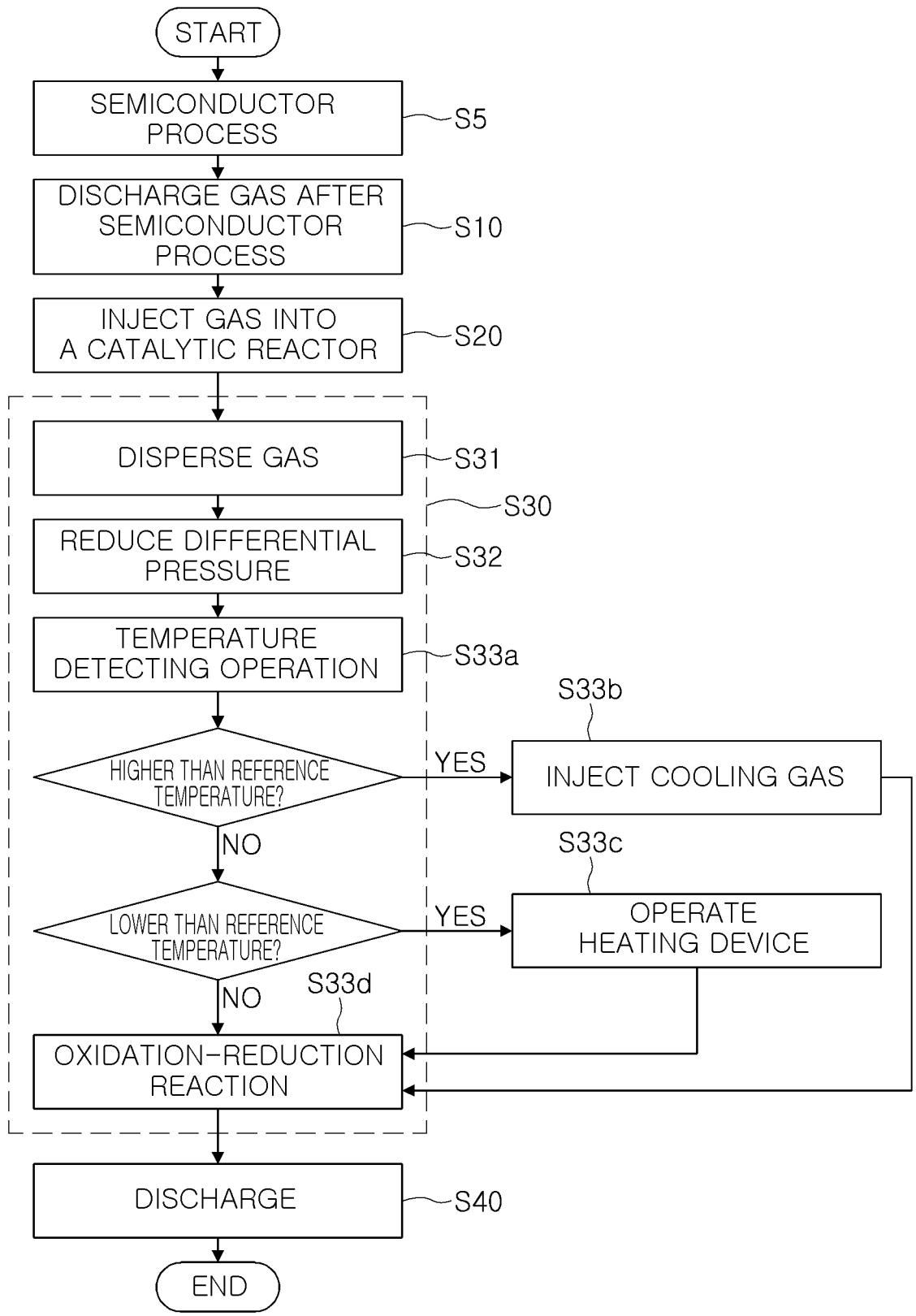
FIG. 15 is a flowchart illustrating a method of processing a semiconductor process gas according to some example embodiments.

FIG. 15 is a flowchart illustrating a method of processing a semiconductor process gas according to an embodiment.

Referring to FIG. 15, in the method of treating a semiconductor process described above with reference to FIG. 13, the catalytic reaction operation (S33) (see FIG. 13) may include an operation step (S33a) of a temperature sensor detecting a temperature of the catalytic reactor.

In some example embodiments, the catalytic reaction operation (S33) may further include a cooling gas introducing operation (S33b) of injecting a cooling gas to the catalytic reactor when a temperature exceeding a reference temperature based on heat resistance of a component is detected in the temperature detector operation (S33a).

In an example embodiment, the catalytic reaction operation (S33) may include an operation (S33c) of heating by operating a heating device when the reference temperature for performing the catalytic reaction is detected (e.g., in the temperature sensor operation step (S33b)) as below a reference temperature.

In addition, the catalytic reaction step (S33) may include an operation (S33d) of an oxidation-reduction reaction of a semiconductor process gas by a catalyst performed after the temperature control performing operation (S33b, S33c) through the operation (S33a) of the temperature sensor.

An apparatus for treating a semiconductor process gas of inhibiting the formation of byproducts by removing a causative substance that generates the powdery byproducts through a catalytic reactor including a catalyst for causing an oxidation-reduction reaction of the process gas may be provided.

While example embodiments have been shown and described above, it will be apparent to those skilled in the art that modifications and variations could be made without departing from the scope of the present inventive concepts as defined by the appended claims.

What is claimed is:

1. An apparatus for treating a semiconductor process gas, the apparatus comprising:
   a gas inlet configured to allow a treatment target gas to flow through;
   a catalytic reaction portion including a catalyst and configured to bring the treatment target gas into contact with the catalyst;
   a space velocity controller between the gas inlet and the catalytic reaction portion, the space velocity controller extending from the gas inlet in a diagonal direction in relation to the gas inlet;
   a differential pressure buffer portion between the space velocity controller and the catalytic reaction portion, the differential pressure buffer portion including a filter; and
   a gas outlet configured to externally discharge a product formed as the treatment target gas comes into contact with the catalyst.

2. The apparatus of claim 1, wherein the filter has a honeycomb structure.

3. The apparatus of claim 2, wherein the filter has a size ranging from 5×5×5 mm to 50×50×50 mm.

4. The apparatus of claim 1, wherein the catalytic reaction portion includes a support body having a honeycomb structure.

5. The apparatus of claim 1, wherein the catalyst includes a metal.

6. The apparatus of claim 5, wherein the metal includes at least one of Cu, Pd, Rh, Pt, Co, V, Mn, Ir, W, or Fe.

7. The apparatus of claim 1, further comprising:
   a first support between the differential pressure buffer portion and the space velocity controller; and
   a second support between the differential pressure buffer portion and the catalytic reaction portion.

8. The apparatus of claim 7, wherein the first support and the second support have a mesh shape.

9. The apparatus of claim 1, further comprising:
   a heating device configured to heat the catalytic reaction portion.

10. The apparatus of claim 1, further comprising:
    a dilution gas injector configured to inject a dilution gas to the catalytic reaction portion.

11. The apparatus of claim 1, further comprising:
    a cooling gas injector configured to inject a cooling gas to the catalytic reaction portion.

12. The apparatus of claim 1, further comprising:
    an oxidizing agent injector configured to inject an oxidizing agent to the catalytic reaction portion.

13. The apparatus of claim 1, wherein
    the treatment target gas includes at least one of a basic gas, an acidic gas, or volatile organic compounds (VOCs), and
    the catalyst includes a material configured to oxidize or reduce the treatment target gas.

14. An apparatus for treating a semiconductor process gas, the apparatus comprising:
    a gas inlet configured to allow a treatment target gas to flow through;
    a differential pressure buffer portion, including a filter, configured to reduce a pressure drop of the treatment target gas; and
    a catalytic reaction portion including a catalyst and configured to bring the treatment target gas into contact with the catalyst,
    wherein the differential pressure buffer portion is disposed between the gas inlet and the catalytic reaction portion.

15. The apparatus of claim 14, wherein
    the treatment target gas includes at least one of a basic gas, an acidic gas, or volatile organic compounds (VOCs), and
    the catalyst includes a material configured to oxidize or reduce the treatment target gas.

16. The apparatus of claim 14, wherein the filter included in the differential pressure buffer portion has a honeycomb structure.

17. The apparatus of claim 14, further comprising:
    a space velocity controller between the gas inlet and differential pressure buffer, the space velocity controller extending from the gas inlet in a diagonal direction in relation to the gas inlet;
    a first support on a first surface of the differential pressure buffer portion facing the space velocity controller; and
    a second support on a second surface of the differential pressure buffer portion opposing the first surface,
    wherein the first support and the second support include a metal and have a mesh shape.

18. A method of treating a semiconductor process gas, the method comprising:
    performing a semiconductor process on a semiconductor wafer in a process chamber;
    externally discharging a semiconductor process gas remaining after the semiconductor process from the process chamber;
    injecting the semiconductor process gas into a catalytic reactor including a catalyst;
    reducing a differential pressure of the semiconductor process gas in the catalytic reactor;
    reacting the semiconductor process gas with the catalyst in the catalytic reactor such that the semiconductor process gas is oxidized or reduced; and
    discharging, to the outside of the catalytic reactor, byproducts formed by the oxidization or reduction by the catalyst.

19. The method of claim 18, wherein the performing the semiconductor process includes depositing a titanium nitride (TiN) on the semiconductor wafer.

20. The method of claim 19, wherein the reacting the semiconductor process gas includes reacting ammonia ($NH_3$), included in the semiconductor process gas, such that the ammonia is oxidized to nitrogen ($N_2$) or a nitric oxide (NOx).

* * * * *